(12) United States Patent
Brummel et al.

(10) Patent No.: US 7,954,882 B2
(45) Date of Patent: Jun. 7, 2011

(54) MEDICAL IMAGING TRAILER WITH THERMAL AND MECHANICAL ISOLATION

(75) Inventors: Anthony D. Brummel, Dyer, IN (US); Daniel W. Rozendal, Dyer, IN (US)

(73) Assignee: Oshkosh Corporation, Oshkosh, WI (US)

( * ) Notice: Subject to any disclaimer, the term of this patent is extended or adjusted under 35 U.S.C. 154(b) by 1224 days.

(21) Appl. No.: 11/606,787

(22) Filed: Nov. 30, 2006

(65) Prior Publication Data
US 2008/0129068 A1 Jun. 5, 2008

(51) Int. Cl.
*A61G 3/00* (2006.01)
(52) U.S. Cl. .................... 296/181.6; 296/24.38
(58) Field of Classification Search .............. 296/181.6, 296/24.35, 24.38, 24.41, 39.1, 39.3; 128/922; 382/128; 600/410, 425; 248/560, 638, 646, 248/647
See application file for complete search history.

(56) References Cited

U.S. PATENT DOCUMENTS

| | | | | |
|---|---|---|---|---|
| 2,222,063 A * | 11/1940 | Beal | ............................. | 296/181.6 |
| 2,657,088 A * | 10/1953 | Clement | ..................... | 296/24.35 |
| 3,057,284 A * | 10/1962 | Learmont | ..................... | 410/135 |
| 3,393,920 A * | 7/1968 | Ehrlich | ........................ | 296/181.6 |
| 3,432,979 A * | 3/1969 | Heimann | ....................... | 52/481.1 |
| 3,746,388 A * | 7/1973 | Robinson | ..................... | 296/181.6 |
| 4,505,126 A * | 3/1985 | Jones et al. | ....................... | 62/239 |
| 4,915,435 A | 4/1990 | Levine | | |
| 5,472,760 A * | 12/1995 | Norvell | ............................. | 428/71 |
| 5,488,339 A | 1/1996 | Havens et al. | | |
| 5,700,118 A * | 12/1997 | Bennett et al. | .................. | 410/113 |
| 5,727,353 A * | 3/1998 | Getz et al. | ........................ | 52/79.1 |
| 5,934,741 A * | 8/1999 | Beukers et al. | ............. | 296/181.6 |
| 5,994,903 A | 11/1999 | Ladebeck | | |
| 6,138,580 A * | 10/2000 | Thoman | .......................... | 105/396 |
| 6,364,388 B1 * | 4/2002 | Ziegler et al. | ............... | 296/24.35 |
| 6,817,866 B1 | 11/2004 | Ginzburg et al. | | |
| 6,941,875 B2 * | 9/2005 | Norton et al. | .................. | 105/397 |
| 7,000,978 B1 * | 2/2006 | Messano | .................... | 296/181.6 |
| 7,025,408 B2 * | 4/2006 | Jones et al. | .................. | 296/186.1 |
| 7,226,122 B2 * | 6/2007 | Crean | ............................ | 296/211 |
| 7,248,047 B2 * | 7/2007 | Mallett et al. | .................. | 324/318 |
| 7,249,921 B2 * | 7/2007 | McMahon et al. | ............ | 410/129 |
| 7,434,520 B2 * | 10/2008 | Zupancich et al. | ............ | 105/423 |
| 2006/0186884 A1 | 8/2006 | Mallett et al. | | |

* cited by examiner

*Primary Examiner* — Glenn Dayoan
*Assistant Examiner* — Gregory Blankenship
(74) *Attorney, Agent, or Firm* — Foley & Lardner LLP (57) ABSTRACT

A trailer for use with a mobile medical diagnostic imaging system includes a first shell having an exterior skin and at least one thermal insulation layer, a second shell within the first shell, the second shell having a first shielding layer, and an air gap between at least a portion of the first shell and the second shell to effectively isolate the first shell from the second shell.

13 Claims, 5 Drawing Sheets

MEDICAL IMAGING TRAILER WITH THERMAL AND MECHANICAL ISOLATION

FIELD

The present invention relates generally to methods and apparatuses for trailers for use with mobile medical diagnostic imaging systems. More specifically, the present description relates to methods and apparatuses for providing a mobile medical scanning trailer having improved RF and magnetic shielding and stability.

BACKGROUND

Medical imaging refers to a process through which medical professionals may visually evaluate an area of a patient's body that is not externally visible. Two common methods of medical imaging are Computed Tomography (commonly referred to as a "CT Scan" or a "CAT Scan") and Medical Resonance Imaging ("MRI"). A MRI system uses powerful magnets and radio frequency pulses to controllably excite hydrogen nuclei in water molecules of a patient's tissue. As hydrogen protons within the tissue relax after the exciting pulse, they emit energy which is generally received by a sensitive coil within the MRI system. Tissue of varying composition will have varying hydrogen proton relaxation rates. The MRI coil will detect these differing rates, and thus, differing tissue compositions, by mathematically analyzing the emitted energy data over time. This mathematical data is converted via the use of a Fourier transform into an image or slice with received data points of differing energy rates having different contrast levels on the image. Depending on the setup of the MRI system, different tissue will have different contrast levels.

Medical imagining systems, and MRI systems in particular, are large, complex, and expensive. As a result, industry has found it beneficial to provide mobile medical imaging units that may be transported, shared, and/or leased by healthcare entities unable or unwilling to purchase a permanently installed medical imaging system. Mobile medical imaging units are typically stored in and transported by a large truck trailer. These truck trailers may be moved from location to location, used as full-service medical imaging facilities, and moved again. These truck trailers generally have an interior cabin which houses the medical imaging systems. The interior cabin may be separated into various rooms or sections. A medical imaging trailer will generally have at least one built-in scan room which allows patients to enter the trailer to complete their medical imaging procedure. Thus, the medical imaging device is not only transported by the trailer, but also operates within the trailer. The environment of the trailer, however, presents certain challenges that plague conventional medical imaging trailers.

Both the exterior environment of a medical imaging trailer and the interior environment of the trailer present design challenges. More specifically, the interaction between the exterior environment of the trailer and the interior environment of the trailer present healthcare affecting design challenges. These design challenges especially affect medical imaging trailers containing MRI devices. A first challenge involves controlling the radio frequency ("RF") integrity of the trailer-located scan room. Since RF coils inside the magnet are used to construct a scanned image, it is important that the transmission of RF noise or RF interference ("RFI") is prevented from entering the interior of the medical imaging trailer. Exterior RF noise may detract from the quality of the medical imaging scans conducted within the trailer. Similarly, emissions from the inside of the trailer to the exterior environment should be minimized to prevent interference with external electromechanical devices which are often sensitive medical and/or communications devices associated with the medical imaging trailer. Because RF noise is a design concern of a medical imaging trailer, RF shielding may be provided to the medical imaging trailer.

A second challenge presented by mobile imaging is the mechanical stability of the trailer. Unlike a stationary medical imaging site within a hospital or other permanent healthcare structure, a medical imaging trailer must be mobile within certain size and weight constraints (e.g., size and weight constraints specified by various government agencies, such as departments of transportation, etc.). A medical imaging trailer must therefore meet these constraints while providing a chassis or frame of sufficient rigidity and stability during the transportation stage and while scanning at a patient care site. Lack of stability, vibration, and excessive "g" loading during transportation can damage the magnet and computer equipment. During operation, the MRI scan is highly sensitive to non-damaging vibrations (e.g., vibrational frequencies provided by motors, compressors, pumps, etc.) and these vibrations may affect medical image quality. Therefore, the trailer usually includes components such as air ride suspension components, a solid chassis, solid structural frames, vibration damping parts, vibration damping landing legs and stabilizing stands, etc.

A third challenge presented to medical imaging trailers, particularly MRI imaging trailers, is the magnetic shielding of the trailer and the shielding structure's possible affects on image quality. No magnetic shielding is often preferred by MRI device manufacturers, but due to the challenging mobile environment of a medical imaging trailer and the strength of the magnetic fields, it is practical to include magnetic shielding with medical imaging trailers. Magnetic shielding, usually in the form of steel shielding applied to the walls of the trailer, is designed to contain magnetic gauss fields within a specified distance from the iso-center of the MRI magnet. Here again, not only does shielding prevent image distortions potentially caused by external magnetic fields during scanning, but also shields the exterior environment from the strong magnetic fields caused by the magnets within the MRI machine. While magnetic shielding on an MRI trailer is meant to provide better quality images when operating in the relatively challenging mobile environment, it has been discovered that sometimes the magnetic shielding of an MRI trailer may actually cause some image distortions. The Applicants believe that the relationship of the magnetic shielding structure, both in proximity and relative stability, to the iso-center of the magnet of the MRI machine may affect scanned image quality. The Applicants also believe that typical MRI trailer-based systems may not perform to the standards provided by most fixed site MRI systems for at least this reason. The Applicants believe that the scanned image quality of a trailer-based MRI system may be affected by the steel shielding of the trailer in at least three ways: temperature variations on the surfaces of the walls and roof of the trailer may cause expansion and/or contraction of the shielding; wind pressure loads applied to the walls of the trailer may move the shielding; and, the steel shield may move because of other vibrations and movements affecting the exterior structure of the trailer.

Regarding temperature variations on the surfaces of the walls and roof of the trailer, it was determined that exterior weather conditions could cause unwanted MRI image artifacts and image distortions. As the surface temperature of conventional MRI trailer walls and roof changed, the walls and roof experienced thermal expansion and contraction. While these variations could occur on a daily basis, they could also occur more frequently, for example, as clouds shifted to block or expose the sun. If the magnetic shield was fastened, coupled, or otherwise in transferable contact with the exterior structure of the trailer, the contraction and expansion of the exterior structure could affect the image to a significant and undesirable extent. Regarding wind load pressure of the exterior wall, it was determined that wind could cause sufficient movement of the exterior wall and coupled magnetic shield to also cause image artifacts and distortions. Regarding stability of the steel shield, it was determined that vibrations and or other movements of the magnetic shield could cause image artifacts and distortions.

There is a need for a medical imaging trailer capable of providing consistently high image quality during changing exterior temperatures, wind pressures, and other instability causing events without greatly increasing the weight and cost of the medical imaging trailer. More specifically, there is a need for a medical imaging trailer design having a stable wall structure with proper insulation, proper RF shielding, and a magnetic shielding structure substantially isolated from movement causing events of the outside environment.

It would be desirable to provide a medical imaging trailer having any one or more of these or other advantageous features.

SUMMARY

According to an exemplary embodiment, a trailer for use with a mobile medical diagnostic imaging system includes a first shell having an exterior skin and at least one thermal insulation layer, a second shell within the first shell, the second shell having a first shielding layer, and an air gap between at least a portion of the first shell and the second shell to effectively isolate the first shell from the second shell.

According to another exemplary embodiment, a trailer for use with a mobile medical diagnostic imaging system includes an outer shell having an exterior skin, at least one insulation layer, and a plurality of interior surface planes, an inner shell having a first shielding layer and a plurality of exterior surface planes; and an air gap between the outer shell and inner shell, wherein the inner shell is located within the outer shell and at least one exterior surface plane of the inner shell is substantially free of contact with the parallel interior surface plane of the outer shell.

According to another exemplary embodiment, a mobile medical imaging system includes a trailer cabin capable of housing a medical imaging device during operation, a plurality of motive members coupled to the cabin and capable of supportively moving the cabin to a plurality of locations, a first shell surrounding the cabin and having a surface plane, an isolation zone surrounding at least half of the first shell, and a second shell surrounding the insulating shell and having a surface plane, wherein the surface plane of the first shell is substantially free of contact with the surface plane of the second shell at locations where the surface planes of the first and second shells are parallel.

According to another exemplary embodiment, a method of constructing a trailer for a mobile medical imaging system includes providing a mobile platform, providing a front wall, a rear wall, a top wall, and side walls, and coupling these walls to the mobile platform to create an outer trailer shell, providing an inner trailer shell having at least a top wall and side walls disposed within the outer trailer shell, the inner trailer shell and the outer trailer shell sharing at least one of a common floor and a common rear wall, and providing an air gap extending substantially along an interface between the front walls, side walls, and top walls of the inner trailer shell and the outer trailer shell.

Other features and advantages of the present invention will become apparent to those skilled in the art from the following detailed description and accompanying drawings. It should be understood, however, that the detailed description and specific examples, while indicating preferred embodiments, are given by way of illustration and not limitation. Many modifications and changes within the scope of the present invention may be made without departing from the spirit thereof, and the invention includes all such modifications.

BRIEF DESCRIPTION OF THE FIGURES

The exemplary embodiments will hereafter be described with reference to the accompanying figures, wherein like numerals generally depict like elements, and.

DETAILED DESCRIPTION

Figure 1:
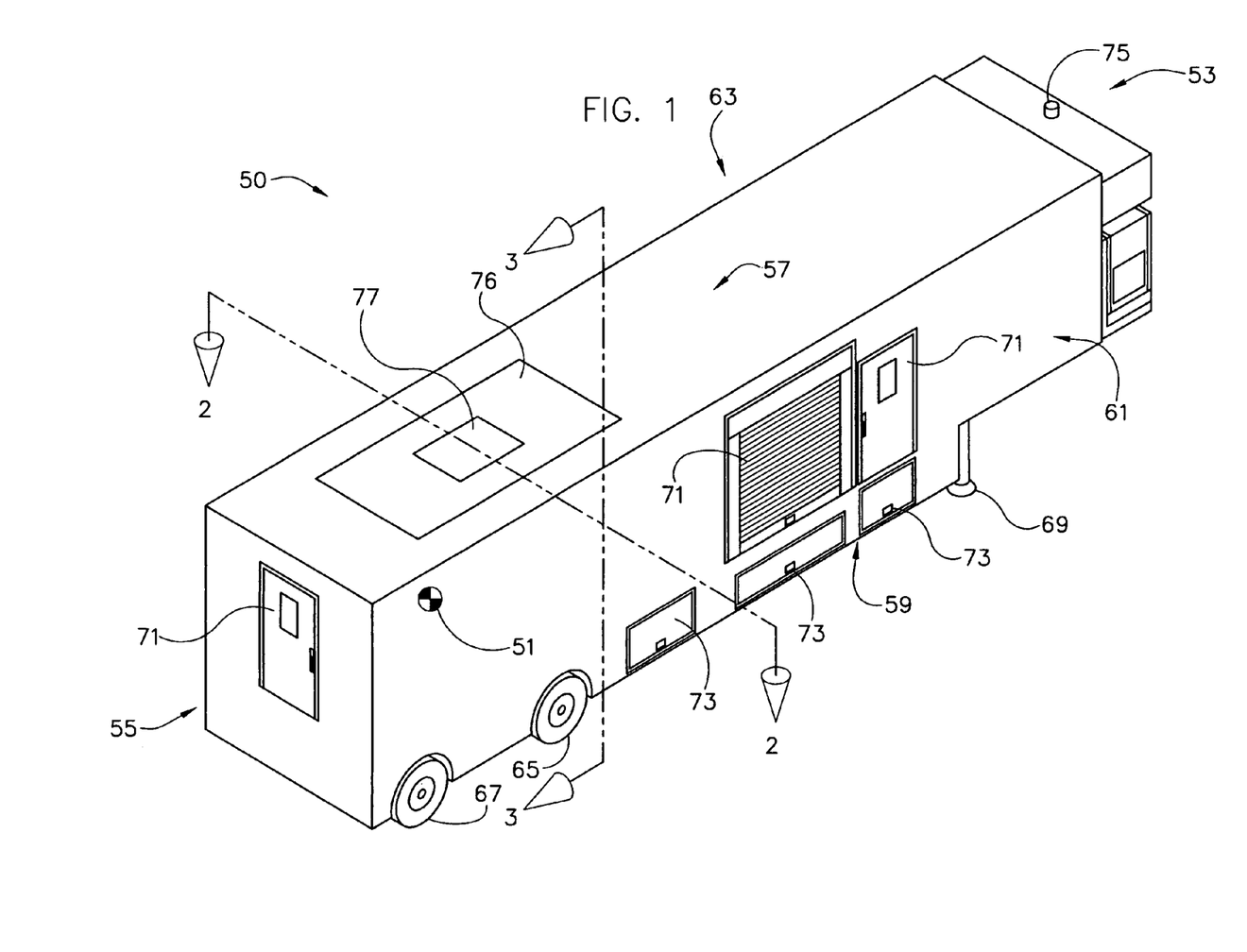
FIG. 1 is a perspective view of a medical imaging trailer, showing the slice locations of FIGS. 2 and 3, according to an exemplary embodiment.

Referring generally to FIG. 1, a trailer is shown according to an exemplary embodiment. The trailer shown is a medical imaging trailer 50 configured to house a mobile medical imaging device such as an MRI device. Trailer 50 generally comprises a frame, motive members coupled to the frame, a trailer bed or platform attached to the frame, a plurality of walls attached to the trailer bed or platform that create an interior cabin, and/or one or more systems for pulling or otherwise accelerating the trailer using a traction device. The cabin generally includes side walls, a ceiling, a front wall, a rear wall, and a floor.

According to an exemplary embodiment, the trailer is configured to house a mobile medical imaging device (e.g., MRI, CT, CAT, X-RAY, etc.) during transport as well as operation. The trailer 50 is shown as a medical imaging trailer configured to house an MRI device during transport and operation. MRI devices use a strong magnet (e.g., 1.5 Tesla, etc.) and accompanying electronics which may be sensitive to the design and construction of the trailer 50. The MRI device (not entirely shown) is represented in FIG. 1 by the MRI device's magnetic iso-center 51 located within the cabin of the trailer 50. Some walls, including the side walls, ceiling, and/or floor of the trailer cabin may include a magnetic shield. The magnetic shield of the trailer, according to an exemplary embodiment, is advantageously decoupled from the exterior structures of the trailer 50. Decoupling the magnetic shielding from the exterior structures of the trailer 50 is intended to allow the MRI device located within the trailer 50 to obtain better quality medical images, may allow the MRI device to operate with increased consistency regardless of temperature, sunlight, background vibrations, wind, and any number of other environmental conditions.

Before discussing the details of the trailer 50, it should be noted at the outset that references to "front," "back," "rear," "top," "bottom," "upper," "lower," "right," and "left" in this description are merely used to identify the various elements as they are oriented in the FIGS., with "front," "back," and "rear" being relative to the normal direction of travel of the trailer 50 when in trailing motion. These terms are not meant to limit the element which they describe, as the various elements may be oriented differently in various applications.

It should further be noted that for purposes of this disclosure, the term "coupled" means the joining of two members directly or indirectly to one another. Such joining may be stationary in nature or movable in nature. Such joining may be achieved with the two members or the two members and any additional intermediate members being integrally formed as a single unitary body with one another or with the two members and any additional intermediate members being attached to one another. Such joining may be permanent in nature or alternatively may be removable or releasable in nature.

Referring further to FIG. 1, according to an exemplary embodiment, trailer 50 is a medical imaging trailer having a front 53, a rear 55, a top 57, a bottom 59, and a pair of opposite sides, including a right side 61 and a left side 63. Trailer 50 is further shown as including motive members 65, 67 (e.g., wheels, tires, axles, etc.), landing legs 69, access doors 71, storage compartments 73, a hitch structure 75, a magnet load hatch 76, and a service hatch 77.

The chassis or frame (not shown) is generally located at the bottom 59 of trailer 50 and supports the components of trailer 50 including, but not limited to, front and rear motive members 65, 67. Front and rear motive members 65, 67 generally comprise ground motive members configured to allow the moving of trailer 50 when pulled, pushed, or otherwise propelled by a driving traction device (not shown). According to various alternative embodiments, motive members 65, 67 may comprise any other suitable mechanism for engaging a ground, track, or other surface so as to propel or suspend trailer 50. For example, motive members 65, 67 may comprise movable tracks such as commonly employed on tanks and some tractors. Although motive members 65, 67 are illustrated as being similar to one another, one set of motive members may alternatively be differently configured than motive members 65, 67. For example, front motive members 65 may comprise wheels while rear motive members 67 may comprise tracks. Additionally, trailer 50 may be a self-propelled trailer, including a drive system (e.g., internal combustion engine, transmission, hybrid engine, electrical engine, etc.) designed to provide driving power to the motive members 65, 67. When configured in this manner, the trailer 50 may include a cab containing engine components, driving controls, etc. The size and weight of the trailer 50 may be optimized for a variety of intended uses, including commercial use and/or military use. According to various alternative embodiments, trailer 50 may have any variety of suitable configurations while still having the features and/or combinations of features of the present invention.

Referring further to FIG. 1, according to an exemplary embodiment, the MRI device represented by magnet iso-center 51 is generally located inside the trailer 50 equidistant (or relatively equidistant) from the side walls of the trailer 50. The distance from the front or rear wall may be at least the same as the distance to any side wall. According to the exemplary embodiment illustrated in FIG. 1, magnet iso-center 51 is located nearer the rear 55 wall than the front 53 wall. Inside the trailer 50, according to an exemplary embodiment, interior walls may form a scan room housing the MRI device. According to an exemplary embodiment, trailer 50 may house more than one room or partition. For example, half of the interior of trailer 50 may comprise a scan room, while the other half may house a waiting area, observation area, and/or a control area. Patients may enter the trailer 50 via one or more access doors 71. While the medical imaging device represented by magnet iso-center 51 may be referred to throughout this application as an MRI device, the medical imaging device of trailer 50 may be any medical imaging device of the past, present, or future that may benefit from the advantages provided by the present invention.

Figure 2:
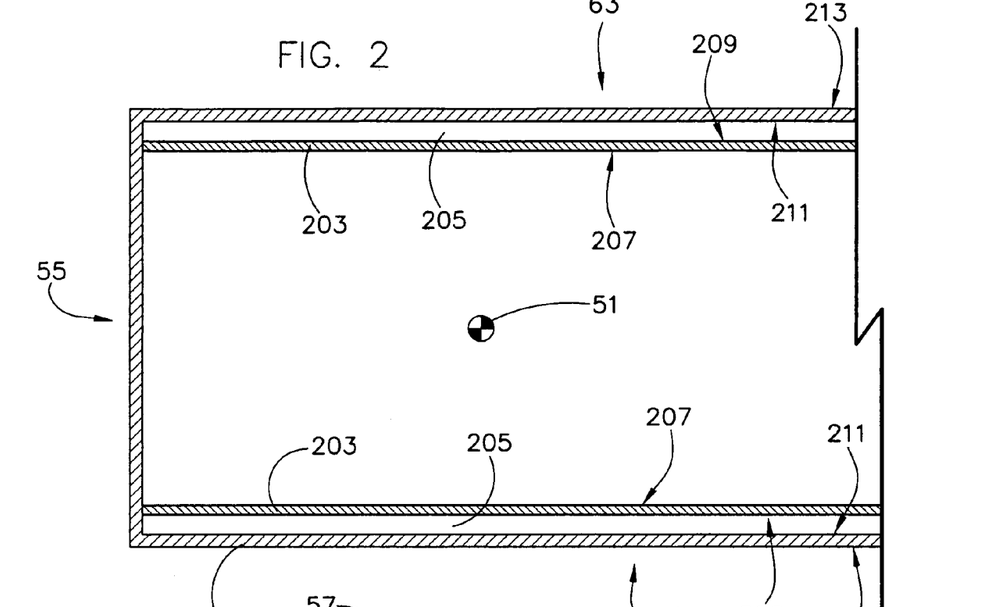
FIG. 2 is a schematic image of a top plan view of a medical imaging trailer, showing the slice created by slice marks 2 of FIG. 1, according to an exemplary embodiment.
Figure 3:
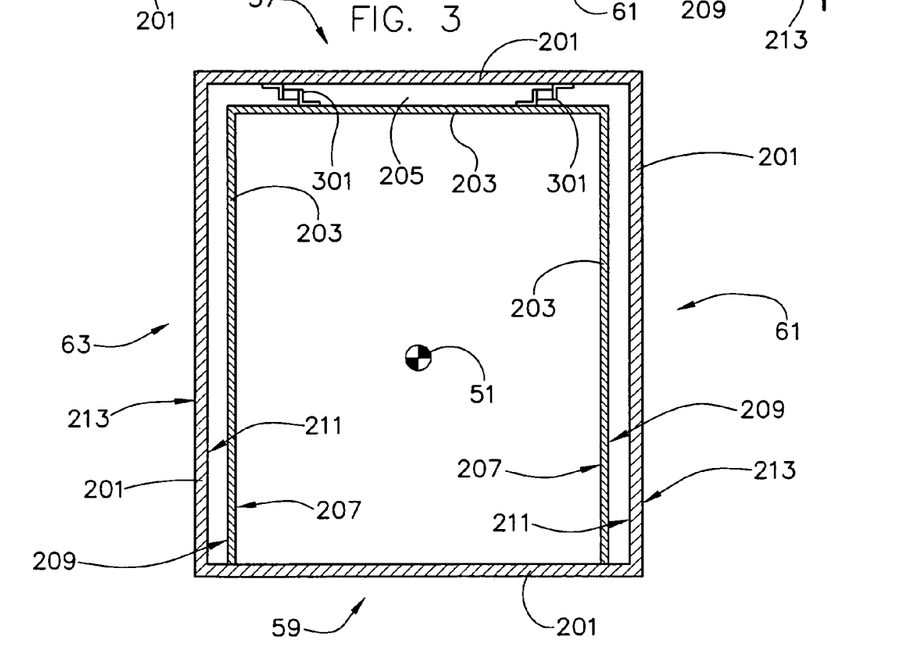
FIG. 3 is a schematic image of a end elevation view of the slice created by slice marks 3 of FIG. 1, according to an exemplary embodiment.

FIG. 1 further includes a set of slice points 2 and 3 meant to show the location of the horizontal and vertical slices of trailer 50 shown in FIGS. 2 and 3. Slice 2 shows the trailer 50 as if it was sliced horizontally from the front 53 to the rear 55 along the middle of sides 61, 63, according to an exemplary embodiment. Slice 2 would create the top plan view of the trailer 50 shown in FIG. 2. Slice 3 shows the trailer 50 as if it was sliced vertically from the top 57 to the bottom 59, according to an exemplary embodiment. Slice 3 would create the end elevation view of the trailer 50 shown in FIG. 3.

Referring to FIG. 2, the slice created by slice 2 of FIG. 1 is shown schematically according to an exemplary embodiment. Accordingly, slice 2 illustrates trailer rear 55, right side 61, and left side 63. The view of trailer 50 shown in FIG. 2 illustrates a first structure referred to as an outer shell 201, and a second structure referred to as an inner shell 203, and an "isolation zone" or "decoupling zone" shown as an air gap 205. Outer shell 201 is largely decoupled from inner shell 203 by air gap 205. Because of this decoupling, environmental conditions affecting outer shell 201 are substantially isolated from also affecting inner shell 203. Magnetic iso-center of the MRI device magnet 51 is shown roughly equidistant from the surfaces of inner shell 203. According to the illustrated embodiment, the outer shell 201 and inner shell 203 are shown to share a common rear wall 55.

Referring to FIG. 3, the slice created by slice 3 of FIG. 1 is shown schematically according to an exemplary embodiment. Accordingly, slice 3 illustrates trailer top 57, bottom 59, right side 61, and left side 63. The view of trailer 50 shown in FIG. 3 includes outer shell 201, inner shell 203, and air gap 205. Similar to FIG. 2, outer shell 201 is shown substantially decoupled from inner shell 203 by air gap 205. Because of this decoupling, environmental conditions affecting outer shell 201 are substantially isolated from affecting inner shell 203. Magnetic iso-center of the MRI device magnet 51 is shown roughly equidistant from the surface of inner shell 203. According to an exemplary embodiment, FIG. 3 illustrates vibration isolators 301 situated between outer shell 201 and inner shell 203 (shown for example as located between top panels of shells 201 and 203). According to the illustrated embodiment, the outer shell 201 and inner shell 203 are shown to share a common floor along trailer bottom 59.

Figure 5:
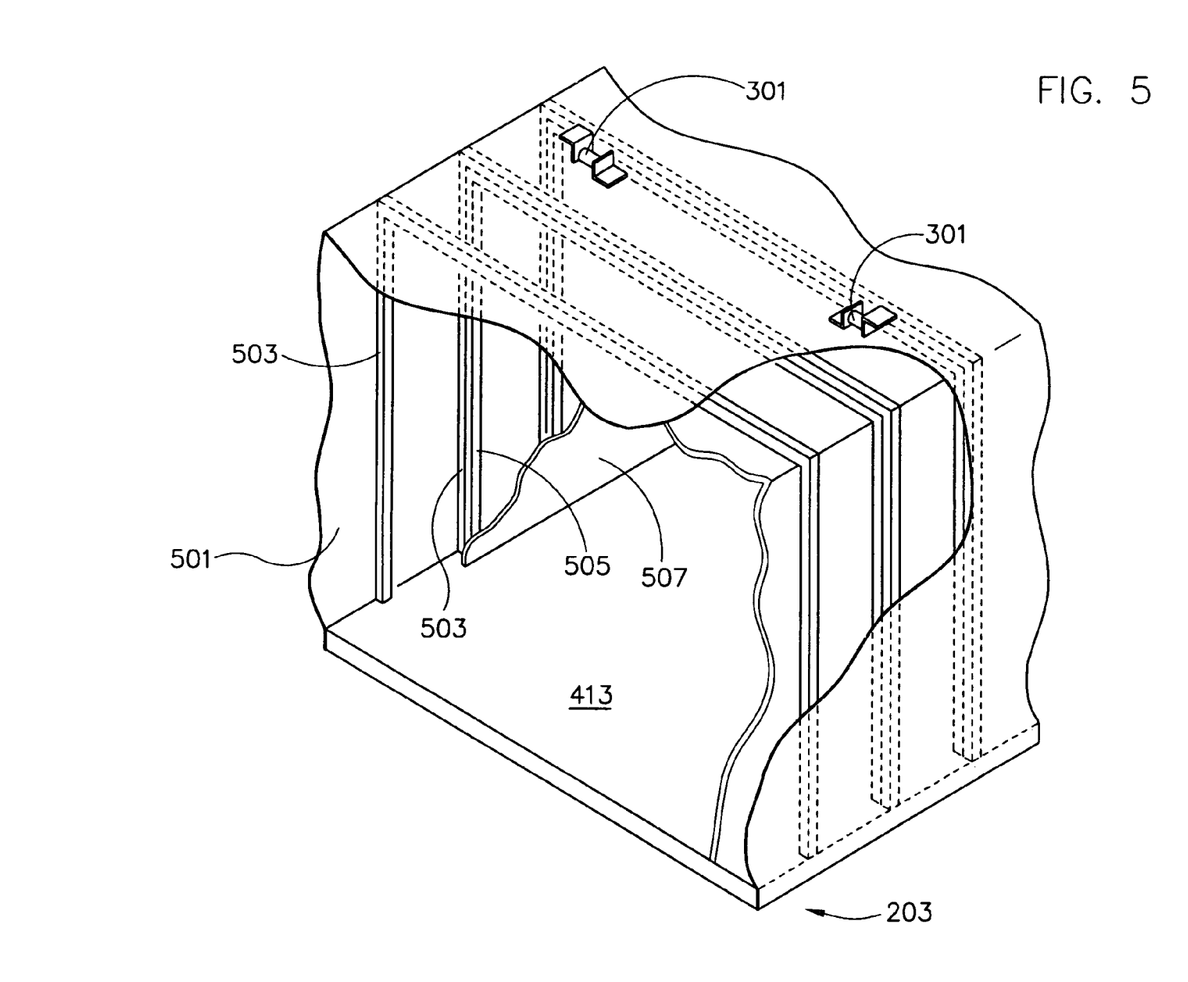
FIG. 5 is a perspective cutaway view of the inner shell of a medical imaging trailer, according to an exemplary embodiment.

Referring to FIGS. 2 and 3, according to an exemplary embodiment, the inner shell 203 includes a magnetic shield 501 (shown further in FIG. 5). Because the magnetic shield 501 of inner shell 203 is decoupled and isolated from the environmental conditions that may affect outer shell 201, due to spurious or transient environmental conditions, degradation of image quality is minimized and the MRI device may advantageously provide consistently high medical image quality compared to conventional trailer designs where the magnetic shield is not decoupled from the outer shell 201 (i.e., the magnetic shield is mechanically and/or thermally coupled to the trailer exterior walls). It is important to note that, according to various exemplary embodiments, outer shell 201 and inner shell 203 may include any number of materials, shields, layers, and/or sub-layers. Trailer 50 may also have more shells including any number of shells. Trailer 50 may also include any number of air gaps between shells. According to an exemplary embodiment, trailer 50 includes at least 2 shells; where the shell containing the primary magnetic shield serving the MRI device is substantially decoupled from the other shells or surfaces of the trailer 50 that may more directly experience vibration, thermal expansion, and/or any other environmental condition.

Referring further to FIGS. 2 and 3, according to an exemplary embodiment, inner shell 203 may share one or more walls or surfaces with outer shell 201. For example, inner shell 203 may share a rear portion (i.e., rear wall, etc.) 55 with outer shell 201. According to other alternative embodiments, inner shell 203 may not have a rear portion, as shown in FIG. 2, rather, only outer shell 201 has a rear portion. According to yet other exemplary embodiments, neither outer shell 201 nor inner shell 203 may form a complete shell. For example, bottom 59 may be the trailer bed or trailer frame and neither shell structure 201 nor shell structure 203 may extend along the surface of bottom 59. According to another exemplary embodiment shown in FIG. 3, bottom 59 is a structure shared by shells 201, 203 and may include components of both. According to alternative embodiments, one or more walls or surfaces of the shells may be shared, combined, coupled, missing, contacting, touching, combined, etc. in any suitable manner sufficient to achieve an effective isolation between the shells. According to other alternative embodiments, the shells may substantially share no common walls or surfaces (e.g., each shell forms a complete prism independent of the other shell, etc.).

Referring further to FIGS. 2 and 3, according to an exemplary embodiment, trailer shells 201, 203 include a number of surfaces and/or surface planes. For example, inner shell 203 may include interior surface planes 207 and exterior surface planes 209. Outer shell 201 may include interior surface planes 211 and exterior surface planes 213. According to an exemplary embodiment, the exterior surface planes 213 of outer shell 201 are the exterior surface planes of the trailer 50. The interior surface planes 207 of the inner shell 203 may be the interior wall surfaces of the trailer cabin and/or scan room. According to various other alternative embodiments, the surface planes of outer shell 201 and inner shell 203 are oriented differently (e.g., may be covered by other surfaces and/or shells, etc.). As illustrated in FIGS. 2 and 3, outer shell 201 and its accompanying surface planes 211, 213 and inner shell 203 and its accompanying surface planes 207, 209 are oriented in a substantially parallel configuration (i.e., interior surface planes 211 of outer shell 201 are parallel with the respective exterior surface planes 209 of inner shell 203, etc.). According to other exemplary embodiments, shells 201, 203 and their accompanying planes are substantially parallel, yet oriented with some degree of angle between them. For example, while outer shell 201 may form a 90 degree angle with trailer bottom 59 (i.e., bed, floor, etc.), inner shell 203 may be slightly angled to provide an 87 degree angle with trailer bottom 59. According to other exemplary embodiments, shells 201, 203 may include some parallel planes or portions and some non-parallel or even perpendicular planes or portions. For example, inner shell 203 may include 45 degree angled corners forming a separate set of corner planes while the corner of outer shell 201 may remain a rectangular ninety degree corner. Furthermore, some areas of shells 201, 203 and accompanying planes may be curved. According to an exemplary embodiment, air gap 205 is located between the interior surface plane 211 of outer shell 201 and exterior surface plane 209 of inner shell 203. Air gap 205 may isolate (i.e., insulate, decouple, disconnect, damp, etc.) outer shell 201 and its surface planes from inner shell 203 and its surface planes.

Figure 4:
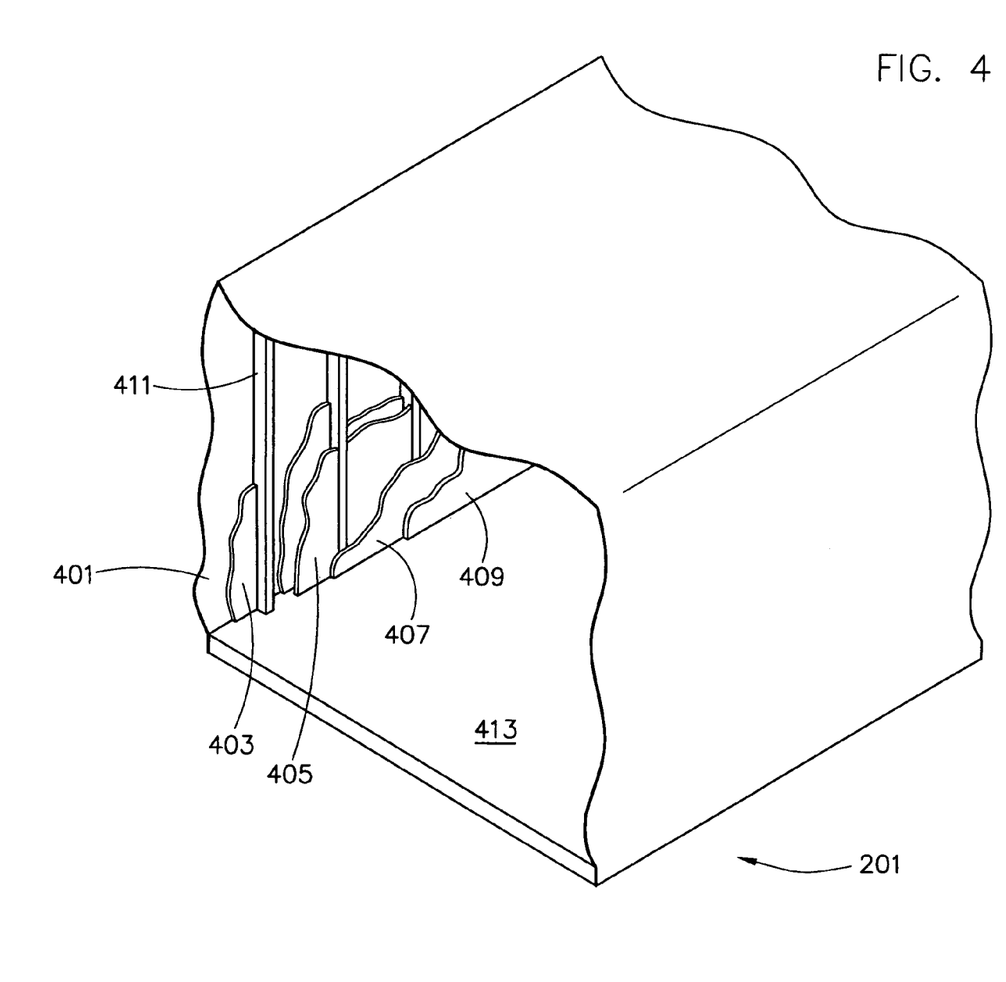
FIG. 4 is a perspective cutaway view of the outer shell of a medical imaging trailer, according to an exemplary embodiment.

Referring to FIG. 4, a perspective cut-away view of outer shell 201 is shown according to an exemplary embodiment. Outer shell 201 may include a number of skins, layers, sub-layers, materials and/or other structures. According to the exemplary embodiment shown in FIG. 4, outer shell 201 is shown schematically to include an exterior skin 401, a first insulation layer 403, a second insulation layer 405, a thermal layer 407, and an RFI shielding layer 409. According to an exemplary embodiment, the first and second insulation layers 403, 405 are installed between framing members 411, and the framing 411 is "sandwiched" between exterior skin 401 and the thermal layer 407. One or more structures of outer shell 201 may include or be coupled to floor 413.

Exterior skin 401, according to an exemplary embodiment, may be a pre-painted skin capable of providing an exterior surface for trailer 50. According to another exemplary embodiment, exterior skin 401 is a skin that is not pre-painted. Exterior skin 401 may be a 0.050 inch external pre-painted skin of some solidity (e.g., metal, hard plastic, fiberglass, etc.). According to other embodiments, exterior skin 401 may be a relatively flexible skin (e.g., soft plastic, tarp-type product, a thin-stretchable product, etc.). According to various other exemplary embodiments, exterior skin 401 may be of any past, present or future material, combination of materials, or design capable of serving as a trailer exterior skin 401.

According to an exemplary embodiment, the exterior skin 401 may be applied to or exists over the exterior of framing 411 of outer shell 201. Framing 411 may substantially form the structure of the outer shell 201. According to other exemplary embodiments, framing 411 may not be present or may simply add support to outer shell 201. According to one embodiment, framing 411 may be vertical 1.25" square aluminum tubing, but may be an apparatus of any past, present or future material or type capable of providing structure or support to the outer shell 201.

Insulation layers 403, 405 according to an exemplary embodiment, may exist within outer shell 201. Insulation layers 403, 405 may be installed between the framing 411 of outer shell 201. At least one insulation layer may have a radiant heat reflectivity characteristic such that radiant heat directed at the trailer is at least partially repelled/reflected. According to an exemplary embodiment, insulation layer 403 includes a foil component having relatively high reflectivity characteristics (e.g., such as having a reflectivity characteristic of greater than about 90 percent, etc.). Insulation layer 403 may also include a bubble component having insulating capabilities. Insulation layer 405 may also include a foil and/or bubble component. Insulation layer 405 may be installed over insulation layer 403 or combined with insulation layer 403. According to an exemplary embodiment, insulation layers 403 and 405 form a foil-bubble-bubble-foil insulation layer (i.e., having two sub-layers of bubble sandwiched between two sub-layers of foil, etc.). According to various other exemplary embodiments, insulation layers 403 and 405 are of any material, structure, or combination thereof from the past, present or future capable of providing an insulating function to the outer shell 201 of trailer 50.

Thermal layer 407, according to an exemplary embodiment, may be installed onto framing 411 and over insulation layers 403, 405. Thermal layer 407 may act as a "thermal break," or a thermal layer intended to prevent structural elements such as framing 411 from acting as a "thermal bridge." Thermal layer 407 may be a wood thermal layer comprising sheets of plywood or compressed composite wood material (e.g., medium density fiberboard, etc.). According to other exemplary embodiments thermal layer 407 may not be present in trailer 50, or may be any material capable of serving as a thermal insulator. Thermal layer 407 may be 0.25 inch plywood. Using a material such as plywood may allow thermal layer 407 to serve as an attachment medium for yet further layers and or structures of outer shell 201. Thermal layer 407 may also consist of multiple sub-layers. For example, thermal layer 407 may also have a foil, bubble, or any other combination of insulating components. According to various other exemplary embodiments, thermal layer 407 may be of any past, present, or future materials or designs capable of creating an insulating layer.

Referring further to FIG. 4, an RFI shielding layer 409, according to an exemplary embodiment, may also exist within outer shell 201. RFI shielding layer 409 may be installed onto thermal layer 407, directly to framing 411, or to or between any other materials of outer shell 201. According to an exemplary embodiment, RFI shielding layer 409 is an aluminum or steel RFI shielding layer that is mounted to thermal layer 407 to essentially complete the construction of outer shell 201. According to an exemplary embodiments, RFI shielding layer 409 provides an RFI shielding function to trailer 50, and, more specifically, to the medical devices of trailer 50. According to other exemplary embodiments, RFI shielding layer 409 may not be present in trailer 50, may not function as an RFI shield, may have other shielding functions, and/or may be of any past, present or future material or design capable of existing within or on outer shell 201.

Referring to FIG. 5, a perspective cut-away view of the inner shell 203 is shown according to an exemplary embodiment. Inner shell 203 may include a number of skins, layers, sub-layers and/or other structures. According to an exemplary embodiment shown in FIG. 5, inner shell 203 includes a shielding layer 501, a skeleton frame 503, furring strips 505, and interior paneling 507. According to an exemplary embodiment, the floor of inner shell 203 is the same floor of outer shell 201. According to an exemplary embodiment, one or more structures of inner shell 203 may include or be coupled to floor 413.

According to an exemplary embodiment, shielding layer 501 is installed as a steel magnetic shield configured to provide a desired amount of magnetic shielding to and for the MRI device of the trailer 50. According to an exemplary embodiment, the shielding layer 501 is installed substantially free of contact from the outer shell 201. For example, shielding layer 501 may be substantially free of contract from the outer shell 201 such that shielding layer 501 is only fastened to the outer shell 201 on the rear wall 55 and by a small number (e.g., two, etc.) of vibration isolators 301 (shown for example as mounted at an interface between the top walls of the shells). According to one exemplary embodiment, substantially free of contact means that almost zero surface area of shielding layer 501 contacts the outer shell 201. According to other exemplary embodiments, substantially free of contact means any amount of surface area contact up to just less than an amount that would result in an undesirable interference with the medical imaging device of trailer 50. It should be noted that while shielding layer 501 is discussed as a steel magnetic shield, shielding layer 501 may by any shielding layer configured to provide a shielding function (e.g., radio frequency, magnetic, electrical, etc.) to the medical device(s) of trailer 50. According to an exemplary embodiment, shielding layer 501 is a shielding layer of any past, present or future design, materials, and/or type capable of providing a shielding function to the medical device(s) of trailer 50.

According to an exemplary embodiment, shielding layer 501 is separated by an air gap 205 from the innermost layer of the outer shell 201 (e.g., layer 409 shown in FIG. 4, etc.). Shielding layer 501 may be a steel shielding layer installed into the trailer 50 as single panels, or assembled in segments or pieces. For example, steel shielding pieces may be installed piece by piece, then plug welded together to form one cohesive steel mass with inside the trailer 50. Shielding layer 501 may include any number of layers, partially overlapping or otherwise. Once the shielding layer 501 has been installed and mechanically isolated or decoupled from the exterior walls, it may be desirable to provide additional stabilizing structures to the shielding layer 501, according to an exemplary embodiment. For example, skeleton frame 503 may be provided to the interior of shielding layer 501 to further stabilize the shielding layer 501 and to prevent movement relative to the magnet iso-center 51. The skeleton frame 503 may be a frame including stainless steel tubing welded to the shielding layer 501 via a number of small steel tabs (not shown). The tabs may be welded to the skeleton frame 503 in any number of configurations, including alternating weld spots or tabs on either sides of individual tubes of the skeleton frame 503. According to an exemplary embodiment, the skeleton frame 503 is a frame including vertical stainless steel tubes which are welded in place in a manner to provide a flush interior surface to which furring 505 and paneling 507 may be attached. According to various other alternative embodiments, frame 503 is constructed of any design or material capable of providing a stabilizing function to the shielding layer 501. Similarly, according to various exemplary embodiments, shielding layer 501 is constructed of and stabilized by any past, present or future material or method capable of providing a shielding function to the medical device(s) of the trailer 50.

Referring to the FIGS., according to an exemplary embodiment, vibration isolators 301 are provided within air gap 205. According to various other exemplary embodiments, vibration isolators 301 may not exist within trailer 50. Vibration isolators 301 are preferably made of rubber, but may be entirely or partially made of any material or materials with vibration damping properties (e.g., foam, wood composite materials, fiberglass, flat foam, convoluted foam, felt, tar, etc.). Vibration isolators 301 may function to absorb, damp, and/or isolate vibrations of the outer shell 201 and trailer 50 from the inner shell 203, and particularly the shielding layer 501. According to an exemplary embodiment, vibration isolators 301 are a number of vibration isolators 301 situated on the ceiling of trailer 50 and located between the outer shell 201 and the inner shell 203. According to various exemplary embodiments, any number of vibration isolators 301 may exist within trailer 50. The FIGS. may illustrate vibration isolators 301 as cylindrical vibration isolators oriented between L-shaped brackets attached to the outer shell 201 and inner shell 203, but vibration isolators 301 may be of many different shapes, sizes or locations. For example, vibration isolators 301 may exist as long rectangular pads located at areas on the exterior of shield 501 adjacent framing 503. Vibration isolators 301 may function to dampen vibrations of trailer 50 and outer shell 201 while ensuring minimal transference of these vibrations to inner shell 203, including shielding layer 501 and framing 503. According to an exemplary embodiment, vibration isolators 301 may only exist at two locations at the front of the magnetic shield that surrounds the MRI cabin within the trailer. According to various other exemplary embodiments, vibration isolators 301 may exist at locations within air gap 205 near magnetic iso-center 51 or at locations relatively far from magnetic iso-center 51. According to an exemplary embodiment, vibration isolators 301 do not diminish the isolated, decoupled or substantially contact free nature of outer shell 201 and inner shell 203. According to various exemplary embodiments, vibration isolators 301 may be of any past, present, or future material, location, or configuration capable of providing a vibration damping function to parts of trailer 50.

Referring to FIG. 5, according to an exemplary embodiment, furring strips 505 may be installed over skeleton frame 503. Furring strips 505 may be designed to support attached interior paneling 507. Furring strips 505 may be wood furring strips designed to hold interior paneling 507 via wood nails, screws, and/or any other fastening and/or securing material or structure. Interior paneling 507 may be finished paneling such that the side of interior paneling 507 facing the interior of the trailer is finished in an aesthetically pleasing manner suitable for the interior of a medical scan room in which patients may feel comfortable. According to other exemplary embodiments, the materials installed over framing 503 may be of any past, present or future configuration.

Figure 6:
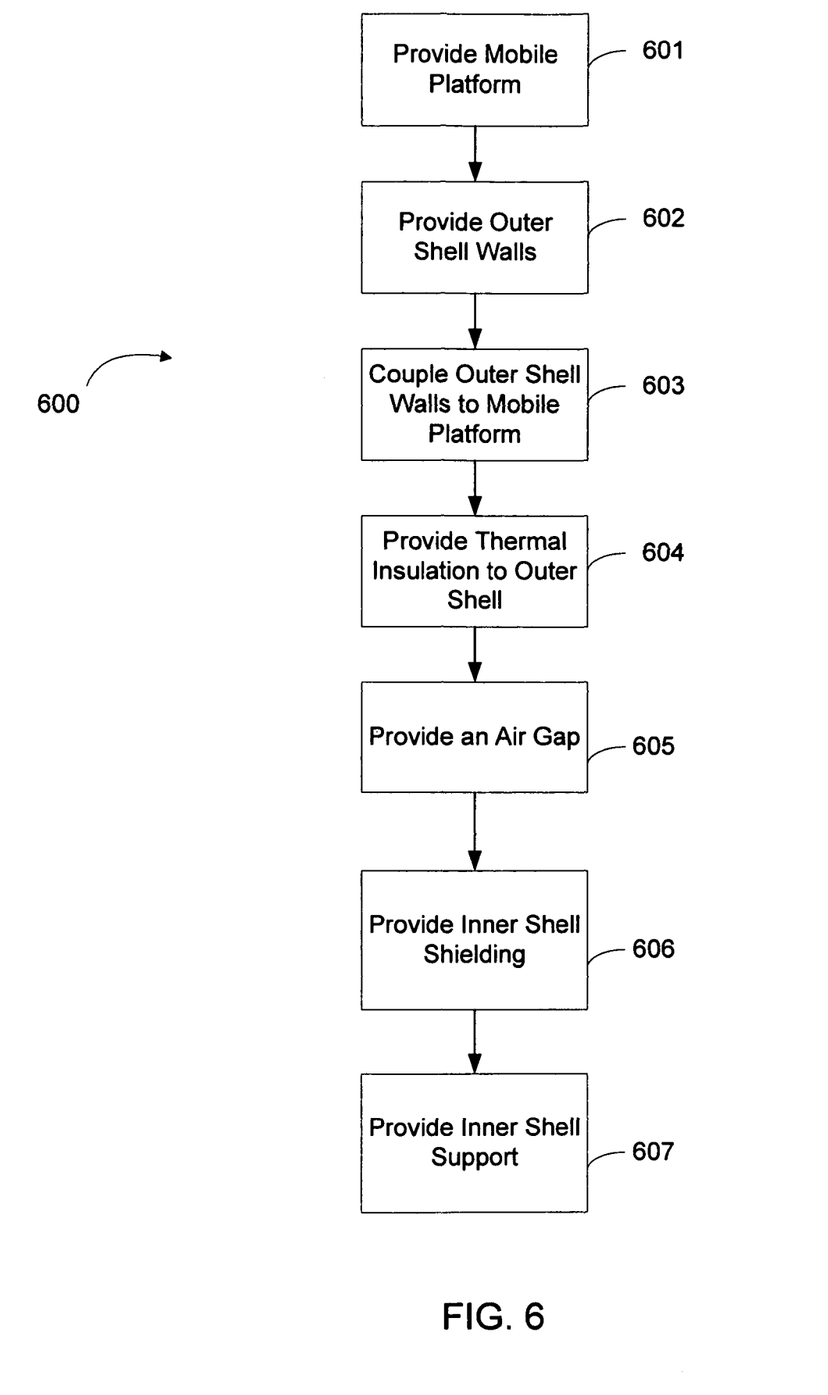
FIG. 6 is a flow chart of a method of constructing a medical imaging trailer, according to an exemplary embodiment.

Referring to FIG. 6, according to an exemplary embodiments, a method for constructing trailer 50 may be provided (process 600, generally) wherein the layers or materials of trailer 50 are installed. Installation may begin at the exterior of trailer 50 and progress roughly towards the inside. Installation may begin with providing a mobile platform (e.g., trailer bed, floor, chassis, frame, etc.) (step 601). Installation may continue by providing walls including a front wall, rear wall, top wall, side walls, etc., and coupling these walls to the mobile platform to create a trailer exterior and a trailer interior (step 602). These walls may be portions of outer shell 201 (step 602). Additional portions of outer shell 201 may then be installed starting from the exterior most layers and working inwards (step 604). For example, outer shell 201 may roughly be installed in the following order: framing 411, exterior skin 401, insulation layer 403, insulation layer 405, thermal layer 407, shielding layer 409, etc. Installation may continue by providing an insulating space over at least an insulating material 403, 405 of outer shell 201 (step 605). Insulating space may be an empty air gap 205 or may be an air gap 205 filled with any damping or insulating material. Installation may continue by installing a shielding layer 501 (e.g., a magnetic shielding surface, shielding sheet(s), etc.) (step 606) over the insulating space (i.e., air gap 205) to begin constructing inner shell 203. Thus, insulating space (i.e., air gap 205) may be located between an insulating material 403, 405 of outer shell 201 and shielding layer 501 of inner shell 203. Installation of inner shell 203 may continue in roughly the same manner as the construction and installation of outer shell 201. In other words, inner shell 203 may be roughly installed in the following order: shielding layer 501, skeleton frame 503 (step 607), furring strip 505, interior paneling 507, etc. Throughout this process, where necessary, certain materials and/or structures of inner shell 203 or outer shell 201 may be coupled to other materials and/or structures of the trailer 50.

According to any preferred embodiment, trailer 50 is an MRI trailer having a front 53, a rear 55, a top 57, a bottom 59, and opposite sides 61 and 63. The side walls 61 and 63 and the top wall 57 have a shell-in-shell configuration in areas surrounding the magnetic iso-center 51 of the MRI device. Outer shell 201 forms the exterior of the trailer walls on the sides and top of the trailer. Outer shell 201 includes an exterior skin 401, two layers of bubble and foil insulation 403 and 405 arranged in a foil-bubble-bubble-foil configuration, a thermal layer 407, an RFI shielding layer 409, and a framing 411 for structural support. Inner shell 203 exists inside outer shell 201 and includes the trailer's primary magnetic shielding layer 501, framing 503, furring strips 505, and interior paneling 507. The inner shell 203, including shielding layer 501, is effectively isolated from outer shell 203 by an air gap 205 between the two shells. At least portions of the inner shell 203 surrounding the magnetic iso-center 51 of the MRI device are substantially free of contact with the outer shell 201. The shell-in-shell structure of the trailer walls is intended to provide a stable exterior and interior structure while isolating the magnetic shielding layer 501 from the environmental effects outer shell 201 may experience.

It should be understood that the construction and arrangement of the elements of the exemplary embodiments are illustrative only. Although only a few embodiments of the present invention have been described in detail in this disclosure, many modifications are possible without materially departing from the novel teachings and advantages of the subject matter recited in the claims. Accordingly, all such modifications are intended to be included within the scope of the present invention as defined in the appended claims. Unless specifically otherwise noted, the claims reciting a single particular element also encompass a plurality of such particular elements. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and/or omissions may be made in the design, operating conditions and arrangement of the exemplary embodiments without departing from the spirit of the present invention as expressed in the appended claims.

What is claimed is:

1. A mobile medical imaging system, comprising:
    a trailer cabin capable of housing a medical imaging device during operation, the trailer cabin comprising a first shell surrounding the cabin and having a surface plane;
    a plurality of motive members coupled to the cabin and capable of supportively moving the cabin to a plurality of locations;
    an isolation zone surrounding at least half of the first shell;
    a second shell surrounding the isolation zone and having a surface plane; and
    a vibration isolator extending between the first and second shells, and configured to at least one of absorb, damp, or isolate vibrations of the second shell from the first shell;
    wherein the surface plane of the first shell is substantially free of contact with the surface plane of the second shell at locations where the surface planes of the first and second shells are parallel.

2. The system of claim 1, wherein the isolation zone comprises an air gap between the first shell and the second shell.

3. The system of claim 1, wherein the first shell includes a shielding layer.

4. The system of claim 3, wherein the shielding layer is at least one of a magnetic shielding layer and a RFI shielding layer.

5. The system of claim 3, wherein the shielding layer is substantially thermally decoupled from the second shell at areas adjacent to a medical imaging device located within the trailer cabin.

6. The system of claim 3, wherein the shielding layer is substantially mechanically decoupled from the second shell at areas adjacent to a medical imaging device located within the trailer cabin.

7. The system of claim 1, wherein the second shell further comprises the exterior shell of the trailer.

8. The system of claim 1, wherein the second shell further comprises at least one thermal insulating layer.

9. The system of claim 1, wherein the vibration isolator is situated between the first and second shells on a ceiling of the cabin.

10. The system of claim 1, wherein the vibration isolator comprises rubber.

11. The system of claim 3, wherein the shielding layer is coupled to the second shell by the vibration isolators.

12. The system of claim 3, wherein the vibration isolator is only positioned at a front of the shielding layer.

13. The system of claim 1, wherein the vibration isolator is cylindrical and is oriented between an L-shaped bracket attached to at least one of the first and second shells.

* * * * *